(12) United States Patent
Kumai et al.

(10) Patent No.: US 6,600,317 B1
(45) Date of Patent: Jul. 29, 2003

(54) MAGNETIC RESONANCE IMAGING METHOD AND APPARATUS

(75) Inventors: Hideki Kumai, Kashiwa (JP); Hiroyuki Takeuchi, Kashiwa (JP)

(73) Assignee: Hitachi Medical Corp., Tokyo (JP)

( * ) Notice: Subject to any disclaimer, the term of this patent is extended or adjusted under 35 U.S.C. 154(b) by 0 days.

(21) Appl. No.: 09/869,577

(22) PCT Filed: Dec. 27, 1999

(86) PCT No.: PCT/JP99/07338
§ 371 (c)(1),
(2), (4) Date: Jun. 27, 2001

(87) PCT Pub. No.: WO00/40149
PCT Pub. Date: Jul. 13, 2000

(30) Foreign Application Priority Data

Dec. 28, 1998 (JP) .......................... 10-372885

(51) Int. Cl.⁷ .................................. G01V 3/00
(52) U.S. Cl. .................................... 324/307
(58) Field of Search ................... 324/307, 309, 324/306

(56) References Cited

U.S. PATENT DOCUMENTS

| | | | |
|---|---|---|---|
| 5,167,232 A | | 12/1992 | Parker et al. |
| 5,225,779 A | * | 7/1993 | Parker et al. ............ 324/306 |
| 5,331,279 A | | 7/1994 | Hatanaka |
| 5,786,693 A | * | 7/1998 | Gullapalli et al. ........ 324/306 |
| 6,023,635 A | * | 2/2000 | Liu et al. ................. 600/410 |
| 6,043,654 A | * | 3/2000 | Liu et al. ................. 324/306 |
| 6,177,795 B1 | * | 1/2001 | Zhu et al. ................ 324/307 |
| 6,288,544 B1 | * | 9/2001 | Bernstein et al. ........ 324/309 |

FOREIGN PATENT DOCUMENTS

| JP | 63117746 | 5/1988 |
|---|---|---|
| JP | 9505 | 1/1997 |

\* cited by examiner

*Primary Examiner*—Edward Lefkowitz
*Assistant Examiner*—Dixomara Vargas
(74) *Attorney, Agent, or Firm*—Cooper & Dunham, LLP.

(57) ABSTRACT

In processing of measurement data of each slab obtained by 3D-TOF multi-slab measurement, data in the overlapped portion of the slabs are weighted and added for each slice position. The weight function is calculated based on parameters set previously and is the same as the slab profile or an approximation curve thereof. The weighted and added data are normalized and reconstructed to obtain images. In the obtained image, signal difference between slabs can be suppressed.

17 Claims, 8 Drawing Sheets

Fig. 7
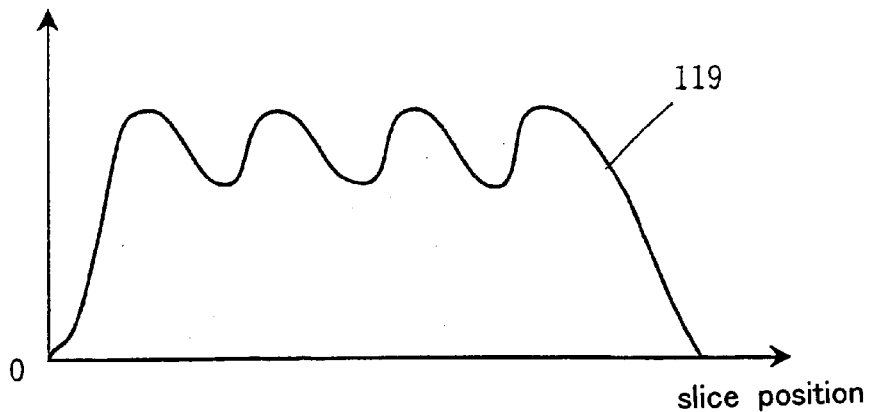
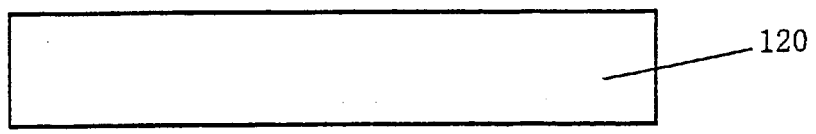
Fig. 8
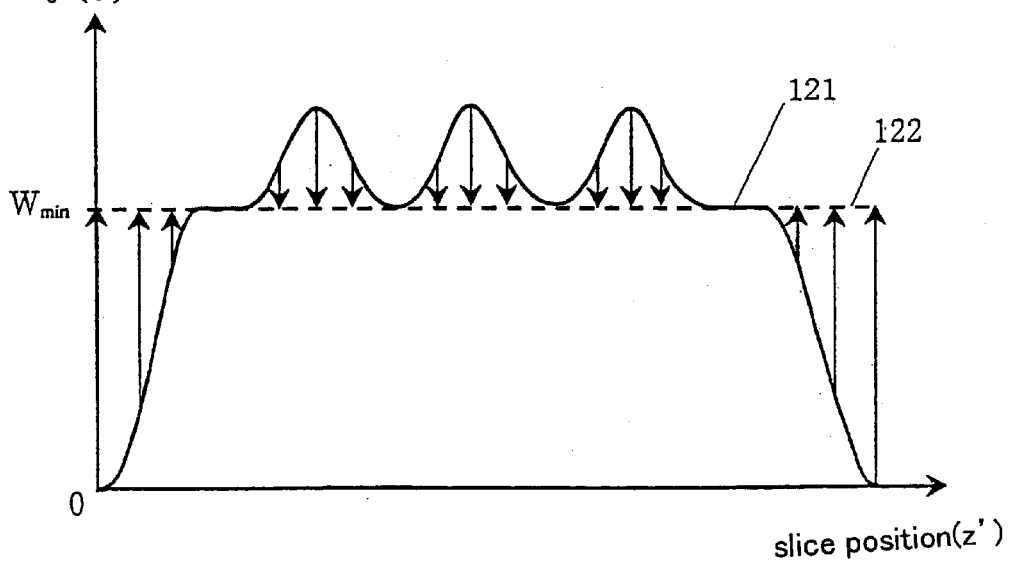

Fig. 11 (Prior Art)
(a)
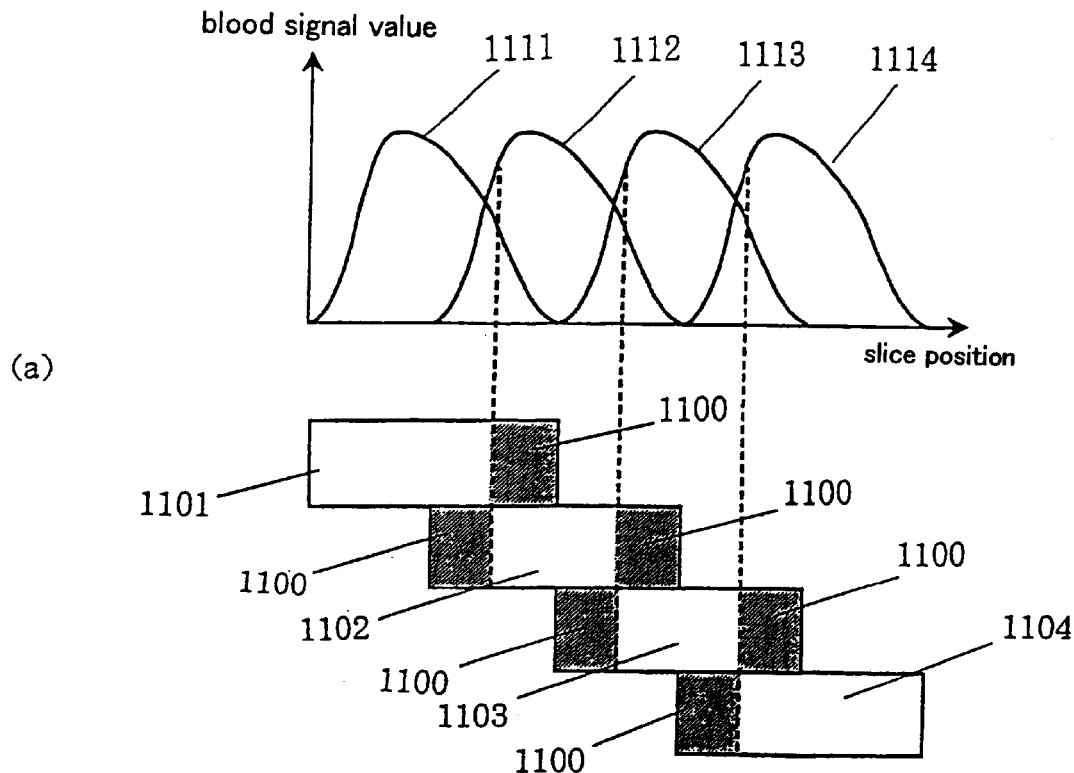
(b)
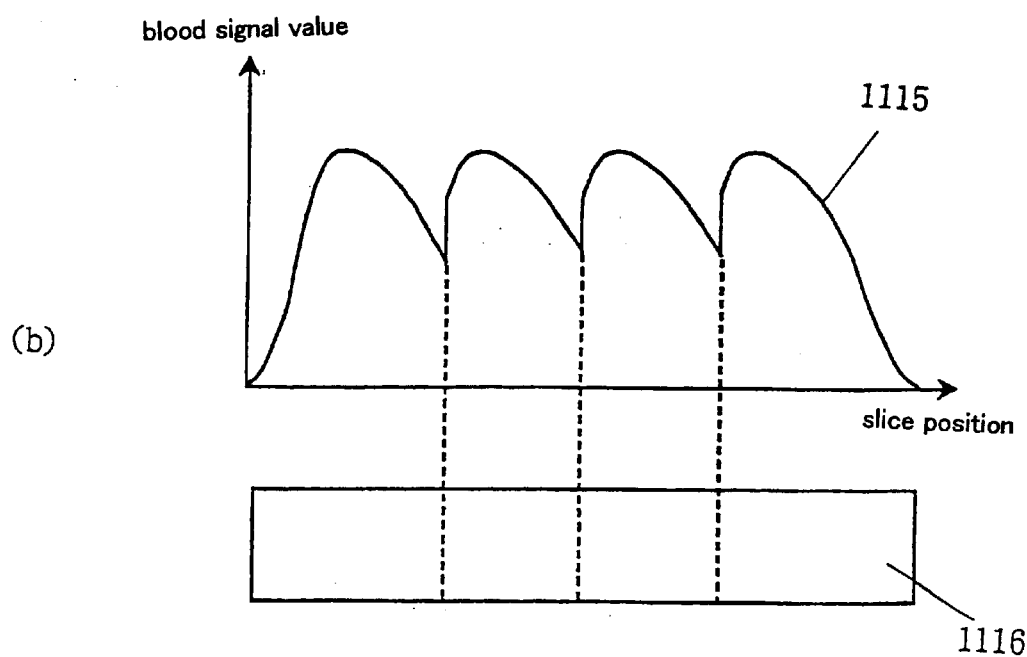

MAGNETIC RESONANCE IMAGING METHOD AND APPARATUS

BACKGROUND OF THE INVENTION

The present invention relates to an imaging apparatus for obtaining a computed tomogram using a nuclear magnetic resonance phenomenon (a magnetic resonance imaging apparatus, abbreviated as MRI apparatus hereinafter). In particular, it relates to an MRI method and apparatus characterized by its image processing in multi-slab imaging for obtaining images of a plurality of slabs.

As an angiography using an MRI apparatus, there is a Time of Flight method (TOF) which utilizes the fact that signals obtained from in-flow blood in a selectively excited region is enhanced. 3D-TOF is a three dimensional measurement thereof, in which a region having a predetermined thickness (slab) is excited as the selectively excited region and signals encoded both in a phase-encoding direction and a slice direction are measured. In the 3D-TOF method, static portions are saturated by repeated excitation of the same slab, and signals of blood, which flows into the region and has not been excited, are obtained. The 3D-TOF method based on such a principle has the following drawbacks.

(1) In a portion where the blood flow is relatively slow, signals in the selectively excited region may be saturated due to repeated excitation of spins and blood signals at the flow-out side of the region are lowered.

(2) In a portion where the blood flow is relatively fast, the excited site moves during the echo time (TE) from the excitation to acquisition of signals and, therefore, signals of blood that flows into the slab immediately after excitation disappear.

Besides these problems, there is another problem regardless of the blood movement. That is, signals at the opposite sides of a slab are lowered because of the imperfect square shape of a slab exciting profile.

In order to suppress a bad influence upon images provided by the above phenomenon, i.e., degradation of blood extraction caused by disappearance of the blood signal due to multiple excitation and by the blood signal disappearance of fast in-flow blood immediately after excitation, a multi-slab imaging was proposed and becomes a main stream. In the multi-slab imaging, as shown in FIG. 11(a), the region to be imaged (1116, seen in FIG. 11(b)) is divided into a plurality of slabs 1101–1104 that overlap each other, and signals obtained from these slabs are processed to obtain an angiogram of the region. In the image processing, the data at the opposite sides of slab (data portion corresponding to the shaded portion 1100 in the drawing) are deleted from data obtained for each slab and the rest of data are connected to reconstruct an image.

Data 1115 produced by connecting the opposite ends of individual slab data has discontinuity at the connected part of slabs as shown in FIG. 11(b), assuming that a blood vessel has blood signal profiles 1111–1114 for each slab. This discontinuity produces a boundary artifact in a blood image and prevents precise diagnosis.

Therefore, an object of the present invention is to provide an MRI method having an excellent blood imaging ability and capable of eliminating the discontinuity between slabs in the multi-slab imaging. Another object of the present invention is to provide an MRI apparatus suitable for realizing the MRI method of the present invention.

SUMMARY OF THE INVENTION

An MRI method according to the present invention performs a three dimensional data measurement of NMR signals successively for a plurality of slabs constituting a desired region of an object and reconstructs images of the desired region of the object by processing the measured data of each slab, wherein a plurality of slabs are selected so that adjacent slabs partially overlap each other and the overlapped data in the measured data of each slab are subjected to weighted addition for each data in the identical slice position. Discontinuity between slabs can be removed by thus weighting and adding the overlapping data. In the MRI method of the present invention, the overlapping degree of 50% or more is particularly effective because data in every slice positions are subjected to addition operation. The overlapping degree of 60–75% is more preferable.

A weight function used in the weighted addition is preferably a slab profile curve or an approximation curve thereof. Data obtained by the weighted addition may be preferably normalized in order to remove the fluctuation of signal values caused accompanying with the weighted addition. A manner of normalization can be changed depending on a slab profile. For example, when the slab profile is square or approximately square, signals are normalized so that the sum of the weight function values becomes constant. When the signal intensities decrease toward opposite sides of the slab profile, for data in a slice position where the sum of the weight function is a constant value S or more, signals are normalized so that the sum W of the weight function becomes the constant value S, and for data in a slice position where the sum W is not more than the constant S, signals are normalized to have values between the weight function value assigned to the data and the constant S. Increase of noise in data at the opposite sides can be suppressed by performing such a normalization processing.

In the MRI method of the present invention, the three dimensional measurement typically includes a blood imaging sequence based on the Time-of-Flight method.

An MRI apparatus according to the present invention comprises magnetic field generating means for generating a static magnetic field, RF magnetic field and gradient magnetic field in a space where an object to be examined is placed, detecting means for detecting NMR signals emitted from the object, signal processing means for reconstructing images of a desired region of the object using the NMR signals, display means for displaying the images, control means for controlling the magnetic filed generating means, detecting means and signal processing means according to a predetermined imaging sequence, means for setting imaging conditions, and being equipped with a multi-slab measuring sequence for repeatedly performing a three dimensional measurement of slabs of the object as the imaging sequence, wherein the setting means comprises means for setting parameters for the multi-slab measurement, and the signal processing means comprises means for performing a weighted addition of data of the overlapping slab portion for each slice position and means for determining a weight function used in the weighted addition based on parameters set by the setting means.

The setting means includes means for setting a number of slabs, a number of slices constituting one slab, and the overlapping degree of slabs as parameters. The MRI apparatus facilitates performance of the MRI method of the present invention.

BRIEF DESCRIPTION OF DRAWINGS

FIG. 7 is an example of a blood signal profile obtained after the weighted-addition operation.

FIG. 8 shows an example of normalization process in the image processing of the present invention.

FIG. 11 is an explanatory view of image processing in the conventional multi-slab measurement.

PREFERRED EMBODIMENTS OF THE INVENTION

Preferred embodiments of the present invention will be explained in detail with reference to the attached drawings hereinafter.

Figure 1:
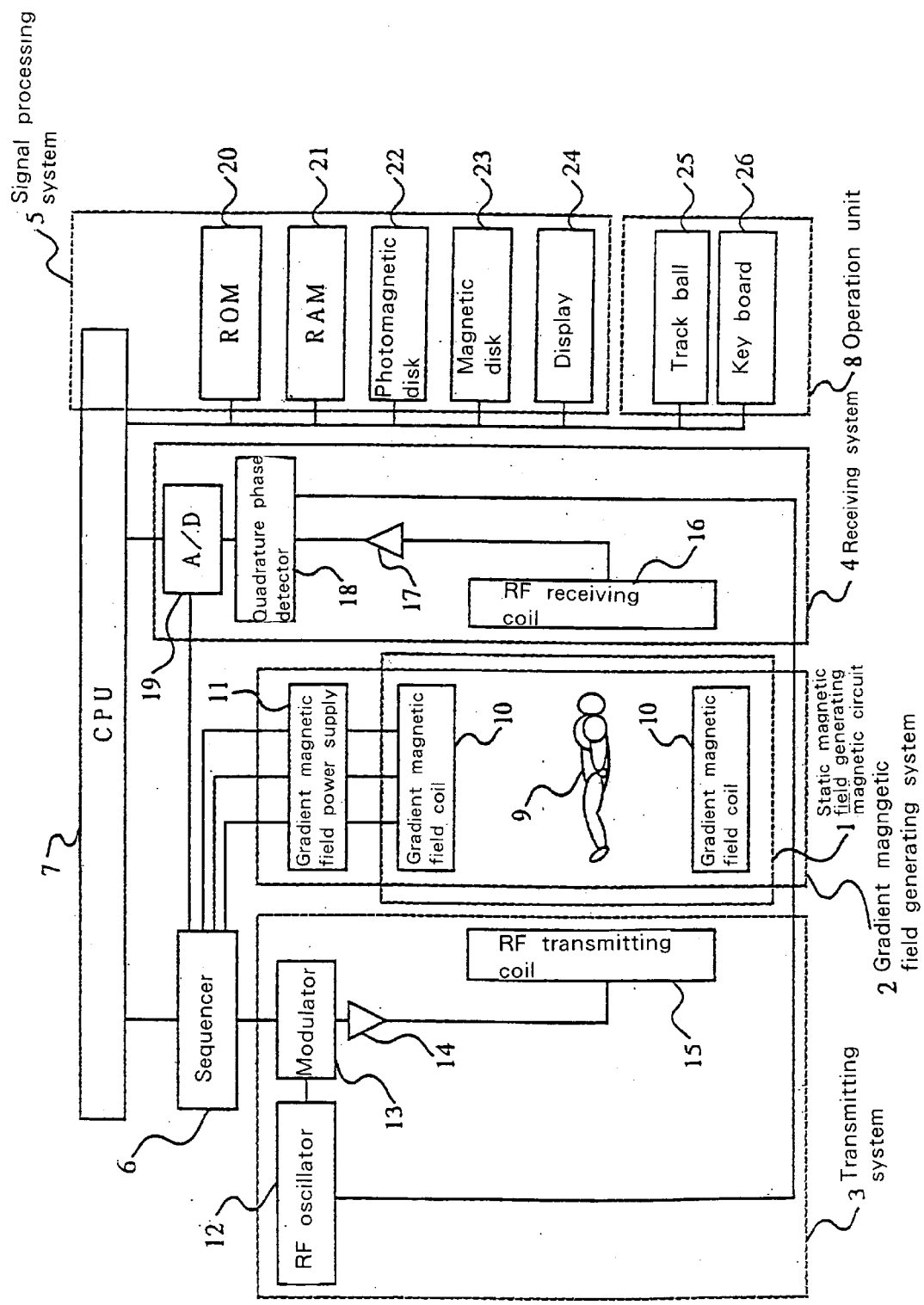
FIG. 1 is a block diagram showing an overall structure of the MRI apparatus applied for the present invention.

FIG. 1 shows a block diagram of an overall structure of an MRI apparatus which employs the processing method according to the present invention.

The MRI apparatus obtains computed tomograms using nuclear magnetic resonance phenomenon and comprises a static magnetic field generating magnetic circuit 1, a gradient magnetic field generating system 2, a transmitting system 3, a receiving system 4, a signal processing system 5, a sequencer 6, a central processing unit (CPU) 7, and an operating unit 8 as main components The static magnetic field generating magnet circuit 1 generates a uniform static magnetic field around an object to be examined 9 in a direction parallel or perpendicular to the body axis of the object 9 and comprises a magnet for generating static magnetic field in a space around the object 9 such as a permanent magnet, a resistive magnet or a superconductive magnet.

The gradient magnetic field generating system 2 consists of gradient magnetic field coils 10 wound in the directions of three axes, x, y, z, and a gradient magnetic field power supply 11 for driving the gradient magnetic field coils 10. The magnetic field power supply 11 is driven according to instructions from a sequencer 6 and applies gradient magnetic fields Gs, Gp, and Gf in the direction of the three axes, X, Y, and Z, to the object 9. A measurement region of the object 9, i.e., slab or slice is determined by selecting the amplitudes of these gradient magnetic fields.

The transmitting system 3 is for producing an RF magnetic field in order to cause nuclear magnetic resonance of nuclei of atoms constituting the living tissues of the object 9 in accordance with the RF pulse transmitted from the sequencer 6, and consists of an RF oscillator 12, a modulator 13, an RF amplifier 14 and an RF coil for transmission 15. The transmitting system 3 amplitudes the RF pulses out put from the RF oscillator 12 by the RF amplifier 14 and supplied to the RF coil 15 located in the vicinity of the object 9 so that electromagnetic waves are radiated onto the objects 9.

The receiving system 4 is for detecting echo signals (NMR signals) elicited through nuclear magnetic resonance of atomic nuclei of the living tissues of the object 9, and consists of a RF coil 16 for receiving electromagnetic waves, an amplifier 17, a quadrature phase detector 18 and an A/D converter 19. Electromagnetic waves (NMR signals) emitted from the object 9 in response to the electromagnetic waves radiated from the RF coil 15 for transmission are detected by the RF coil 16 located in the vicinity of the object 9, input into the A/D converter 19 through the amplifier 17 and the quadrature phase detector 18 and thereby converted into digital signals. The sampling data obtained by the quadrature phase detector 18 at times instructed by the sequencer 6 are collected as two series data and transferred to the signal processing system 5.

The signal processing system 5 is for performing image reconstruction operation using the echo signals received by the receiving system 4 and for displaying the image, and consists of the CPU 7, memories and a display unit. CPU 7 performs operations such as Fourier transform, correction coefficient calculation, image reconstruction and so forth, and controls the sequencer 6.

CPU 7 also performs computation of a weight function and weighted-addition operation when the measured data of each slab obtained in a multi-slab imaging are subjected to weighted addition using a weight function according to the present invention. Algorithms for the above-mentioned operation are incorporated into CPU 7 as programs and performed using parameters input through the operating units 8 as explained later.

Memories are consisting of ROM (Read Only Memory) 20 which stores programs for performing measurement and image analyzing process sequentially, and constant parameters used in the programs, RAM (Random Access Memory) 21 which temporarily stores measurement parameters obtained in the measurement, echo signals detected by the receiving system 4, images used for determining ROI (Region of Interest), parameters used for determining the ROI and so forth, and photo-magnetic disk 22 and magnetic disk 23 which function as data storing units for storing image data reconstructed by CPU 7, and display 24 for displaying the image data read from the photo-magnetic disk 22 or magnetic disk 23 as a tomogram.

The sequencer 6 is control means for repeatedly applying RF pulses in a given pulse sequence to cause nuclear magnetic resonance of nuclei of atoms constituting the living tissues of the object 9. The sequencer 6 operates under the control of the CPU 7, and sends various kinds of instructions necessary for collecting data for obtaining tomograms of the object 9 to the transmitting system 3, the gradient magnetic field generating system 2 and the receiving system 4. In the present invention, the sequencer 6 controls the transmitting system 3, gradient magnetic field generating system 2 and receiving system 4 so that a multi-slab imaging sequence is performed based on the 3D-TOF.

The operating unit 8 (setting means) is provided for inputting information for controlling processing in the signal processing system, and comprises a track ball 25, a key board 26 and a liquid crystal display for displaying GUI for data input (not shown in the drawing). Measurement parameters required for the multi-slab measurement performed in the apparatus (a number of slabs, a number of slices constituting on slab, a phase-encode number, slab overlapping degree and so forth) can be set through the GUI.

Figure 2:
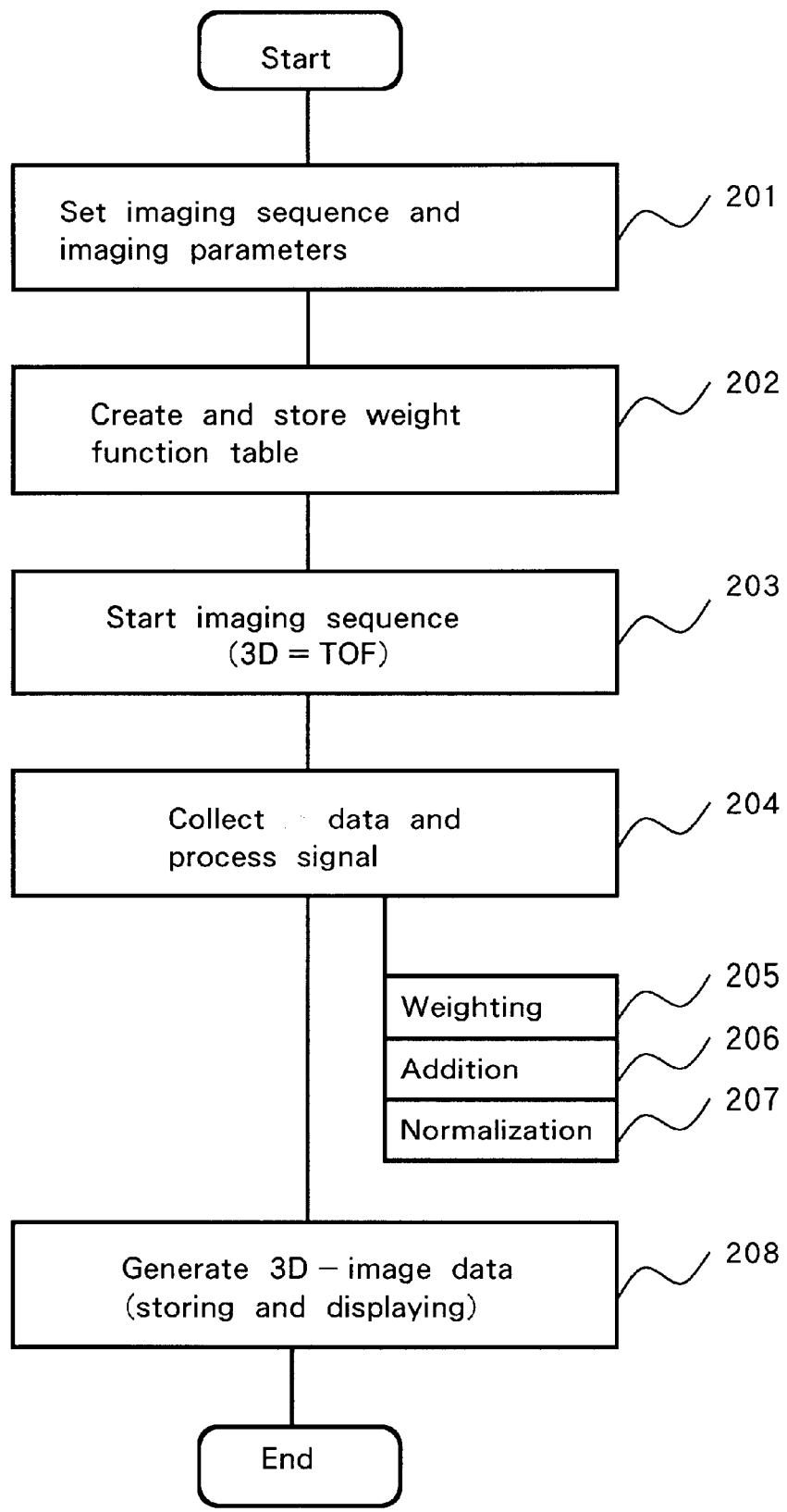
FIG. 2 is a flow chart showing a procedure of multi-slab measurement according to the MRI apparatus of the present invention.

The multi-slab measurement and successive image processing performed in the above-mentioned MRI apparatus now will be explained in detail. FIG. 2 illustrates a procedure of the processing.

First, 3D-TOF sequence is selected as an imaging sequence through the operating unit 8 and a number of slabs, a number of slices constituting one slab (slice-encode number), a phase-encode (projection) number, the slab overlapping degree and so forth are input and set as measurement parameters. The measurement parameters may be input in terms of numeral values or in terms of other parameters such as a resolution degree or SN depending on their nature (step 201). The parameters are stored in RAM 21.

Once the measurement parameters are input, CPU7 calculates a weight function necessary for image processing. The manner of calculating the weight function will be explained later. The calculated weight function is stored in the memory, for example, as a table data (step 202).

Figure 3:
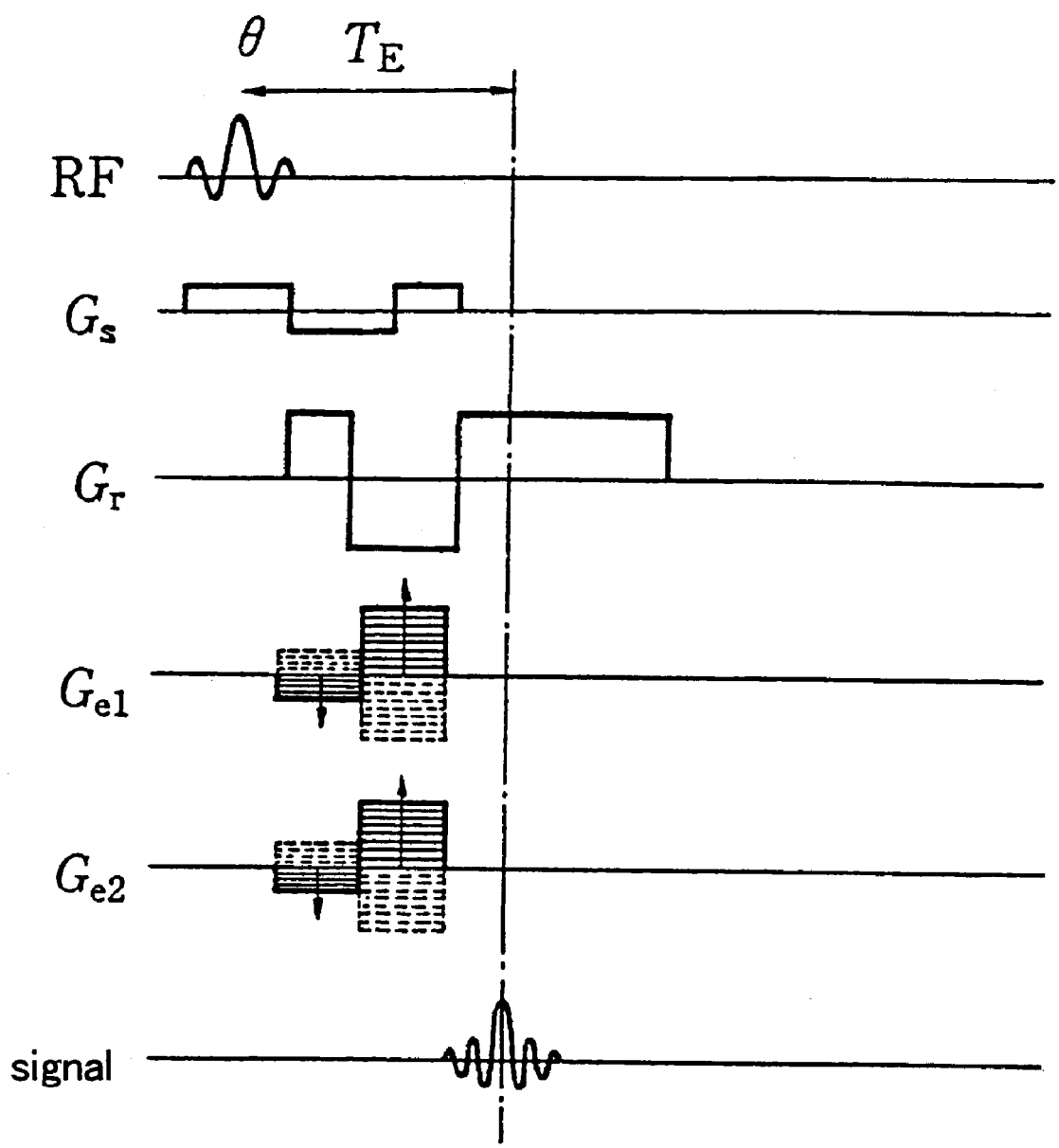
FIG. 3 is a timing chart of an exemplary pulse sequence for multi-slab measurement performed in the MRI apparatus of the present invention.

Then, the imaging sequence according to 3D-TOF is carried out (step 203). An exemplary pulse sequence of 3D-TOF is shown in FIG. 3. According to the sequence, a high frequency pulse RF is applied together with a gradient magnetic field pulse Gs for selecting a slab and, then, a readout gradient magnetic filed pulse Gr for generating a gradient echo signal is applied together with a gradient magnetic field pulses Ge1 and Ge2 for phase-encoding and slice-encoding the echo signal. Thereafter, the echo signal is acquired. Such a sequence is repeated a necessary number of times (=phase-encoding number×slice-encoding number) while changing the intensity of the phase-encoding gradient magnetic field or slice-encoding gradient magnetic field to obtain 3D-measurement data of the selected slab.

As changing the slab to be selected, a similar 3D-TOF sequence is repeated to collect 3D-measurement data of a predetermined number of slabs respectively. In the repetition procedure, the slab is selected so that the adjacent slabs partially overlap according to the preset overlapping degree. The acquired data is stored in RAM 21.

Figure 4:
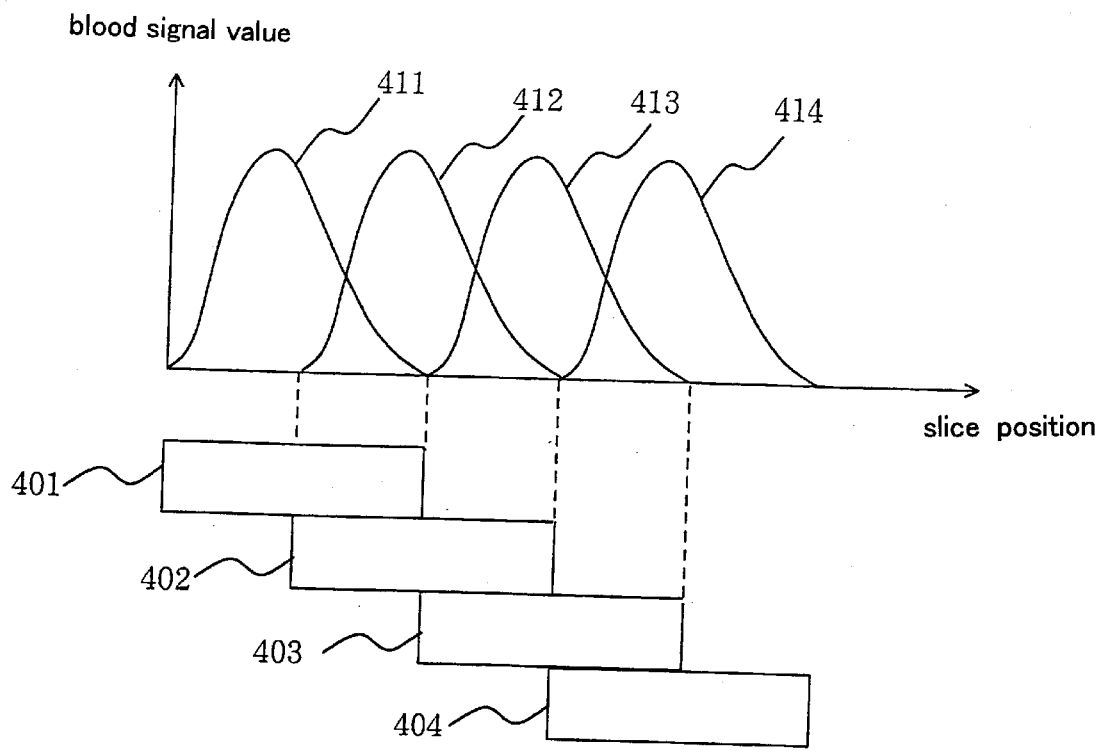
FIG. 4 is a schematic view of data obtained by multi-slab measurement.

FIG. 4 shows blood signal profiles 411–414 for measurement data of four slabs 401–404, in which the slabs overlap with an overlapping degree of 50%. This means that, in the example shown in the drawing, there is two slab data in one slice position except the opposite sides of the overall measurement data.

CPU 7 produces an integral measurement data for all of the slabs by processing the measurement data including the above-mentioned overlapping data (step 204). This process comprises a step 205 of weighting the measurement data for each slab using the predetermined weight function, a step 206 of adding the weighted data in an identical slice position, and a step 207 of normalizing the data in each slice position.

Although the measurement data is shown as a blood signal profile in FIG. 4, actually it is a three-dimensional data Dj (x,y,z) (j is a slab number) having variables of a sampling number x, a projection number y (phase-encode) and a slice number Z (slice-encode). In the following steps, the two-dimensional data having an identical slice number (in the same slice position) are subjected to addition.

In the weighting step 205, each slab data is weighted according to the predetermined weight function. As the weight function, a slab profile or approximation curb thereof can be used.

The slab profile is defined by the shape of a high frequency pulse RF and a gradient magnetic field pulse Gs for selecting the slab and, therefore, can be known by pre-measurement using a phantom or the like or by simulation. A typical approximation curve may be one having (1) a characteristic that the weight simply changes from 0 to 1.0, or (2) a characteristic that the weight changes slowly at the opposite sides of the slab. The approximation curve is calculated by CPU 7 and stored in the memory as a table beforehand. Weight function W(i) (i is a value selected from 0–n, n is a number of slices per slab) defined by the following equations (1)–(3) may be used as the approximation curve having the aforementioned characteristics. When $$0 \leq i < \frac{n}{2} - C \qquad w(i) = \sin^2\left(\frac{\pi/2}{\frac{n}{2} - C} \times i\right) \qquad (1)$$

$$\text{When } \frac{n}{2} - C \leq i \leq \frac{n}{2} + C \quad w(i) = 1.0 \qquad (2)$$

$$\text{When } \frac{n}{2} + C < i < n \qquad w(i) = \sin^2\left(\frac{\pi/2}{\frac{n}{2} - C} \times \left\{i - \left(\frac{n}{2} + C\right) + 1\right\}\right) \qquad (3)$$

Figure 5:
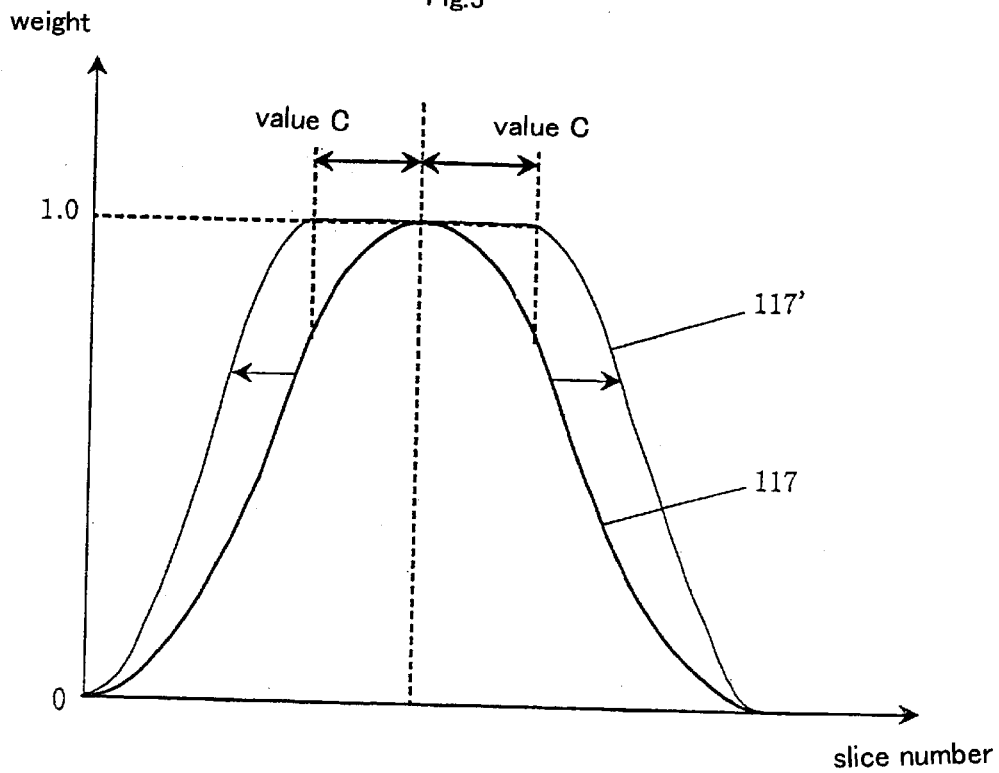
FIG. 5 is an explanatory view of a first step of image processing (weighted-addition) according to the present invention.

In the equation, C is selected arbitrary within 0–(n/2–1) so that the value of the weight function becomes 1. The value C varies depending on the slab profile. Closer to a square shape the slab profile is, closer the C value is to (n/2–1). Further, the value C may be selected so that the optimum S/N can be obtained in the processed image and a signal leap in blood flow and background can be suppressed. It is practical that the value C is automatically determined when the slab thickness is determined by inputting the measurement parameters. FIG. 5 shows the weight functions defined by the equations (1)–(3), where the value C is 0 in Curve 117, and C=n/6 in Curve 117'.

The weight function may not necessarily be the above-mentioned sin function but may be an approximation curve of slab profile or any curve satisfying the aforementioned curve characteristics. The similar effect can be obtained using for example a cubic function defined by the following equation (4) if proper constant values are employed.

$$w(i) = ai^3 + bi^2 + ci + d \qquad (4)$$

Figure 6:
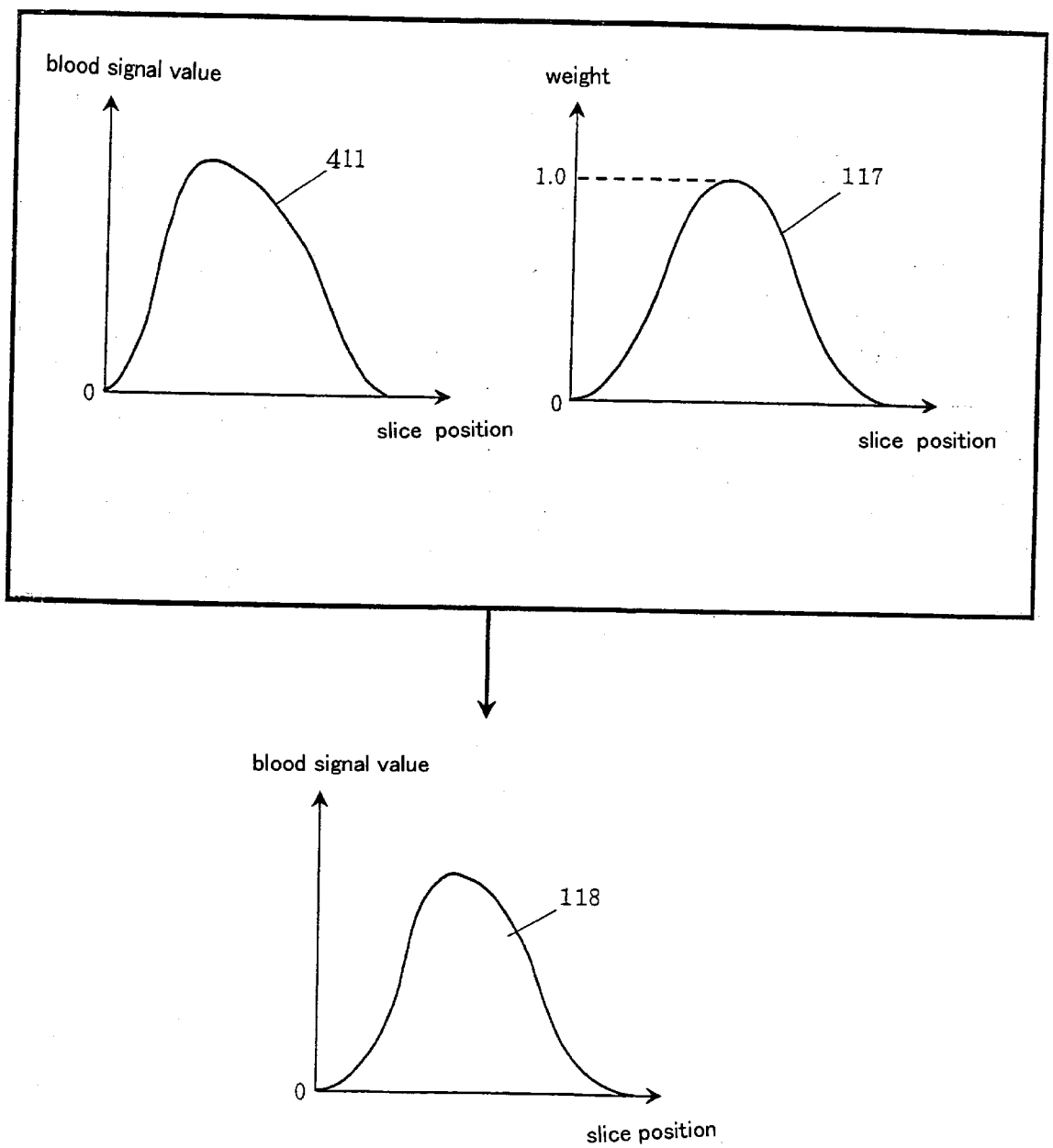
FIG. 6 shows a weight function used in the image processing of the present invention.

As aforementioned, since the weight function is previously calculated by CPU 7 and stored in the memory, once the measurement data of each slab is collected, CPU 7 multiplies the data by the stored weight function w(i) (FIG. 2, step 205) and add the data in a same slice position (step 206). These steps are shown in FIGS. 6 and 7. FIG. 6 shows that a slab profile 118 is obtained by multiplying data 411 of a slab 401 of slabs shown in FIG. 4 with a weight function 117 shown in FIG. 5. Such a weighting operation is conducted for all of slabs and the weighted data are added to obtain a blood signal profile Ds(x,y,z') 119 (z' is a slice number of the added data) for the overall measurement region 120 as shown in FIG. 7.

As shown in FIG. 7, fluctuation in signals occurs in the blood signal profile 119 (Ds) obtained after the addition operation because the sum of the weight function is not same for each slice. In order to remove the fluctuation, data are normalized (step 207).

Normalization is a division operation in which, as shown in the following equation (5), each slice data is divided by a variable N, which is determined according to the W(z') value.

$$D_0(x, y, z') = \frac{D_s(x, y, z')}{N} \qquad (5)$$

In the equation, $D_0$ represents output data after normalization.

When the slab profile is approximately square, the sum $W(z')$ of the weight function $w(i)$, with which data in a same position is multiplied, is determined to have an approximately constant value S for output data in each slice position.

The minimum value $W_{min}$ of the sum W of the weight function may be used as the constant S. Minimum of the sum W exists in each overlapped portion and has an identical value as analogized from the blood signal profile shown in FIG. 7. Accordingly, any minimum value can be used. In case that S is thus determined, the normalizing value N is represented by the following equation (6).

$$N = \frac{W(z')}{S} \quad (6)$$

Normalization is performed by calculating the aforementioned equation (5) using the normalizing value N so that the sum of the weight function becomes constant. FIG. 8 shows the state where all of the data obtained after the weighted addition operation is normalized. In the drawing, 121 indicates a profile of the sum of the weight function in a case that each slab data shown in FIG. 4 is weighted and added using the weight function 117' shown in FIG. 5 and 122 indicates a profile after normalization. As shown in the drawing, data having no signal fluctuation for each slice position can be obtained.

Although data of all slices are subjected to normalization using a constant value N in the aforementioned step, the normalizing value N is preferably changed depending on whether the sum W of the weight function is more than the constant value or not, when the slab profile is not square but has a shape where the height decreases toward the opposite sides of the profile. Such a case now will be explained with reference to examples shown in FIGS. 9 and 10.

Figure 10:
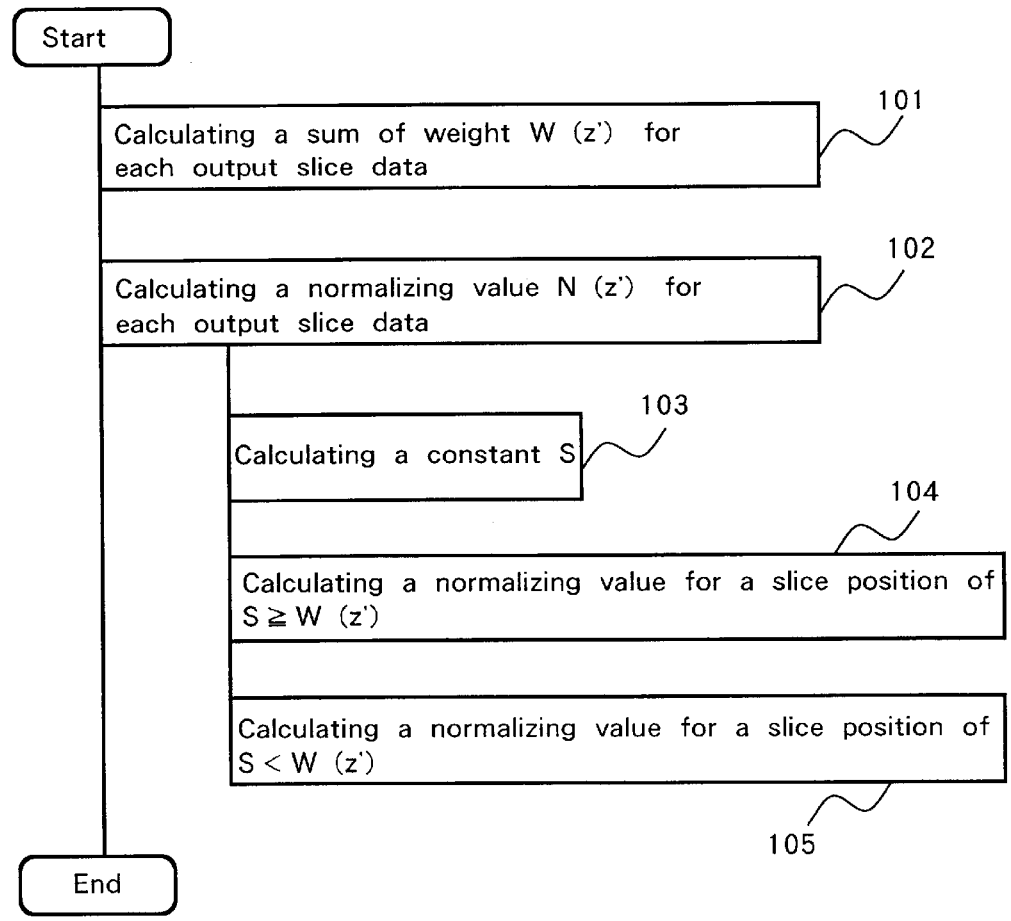
FIG. 10 is a flow chart of the normalization process in the image processing of the present invention.

As shown in the flow chart of FIG. 10, the normalizing process consists of a step 101 of finding the sum value $W(z')$ of the weight function w (I) for each slice position and a step 102 of calculating the normalizing value N for each slice position of the output data. In the step 102, after the constant S (for example $W_{min}$) is calculated (step 103), a normalizing manner is selected depending on whether the sum of the weight function is S or more or less. For the data whose $W(z')$ is the constant value or more (data within a region 126), normalization process using the equation (5) is performed similarly to the aforementioned normalization (step 104). For the slice data whose $W(z')$ is less than S (data within 125, 127), normalization is conducted by determining N so that $W(z')$ falls within a value between $W(z')$ and S (step 105).

For example, the data whose $W(z')$ is S or less are subjected to the process represented by the following equation (7).

$$D_0(x, y, z') = \frac{D_s(x, y, z')}{\frac{W(z')}{S \times \alpha}} \quad (7)$$

In the equation, $\alpha$ is a variable having a value between 0–1.0.

Alternatively, normalization may be conducted so that $W(z')$ fits a function $f(z')$ satisfying the predetermined characteristics. The characteristics which the function $f(z')$ should satisfy are (1) the value decreases toward the opposite sides of the slab, and (2) the value of the function satisfies $W(z') \leq f(z') \leq S$.

Figure 9:
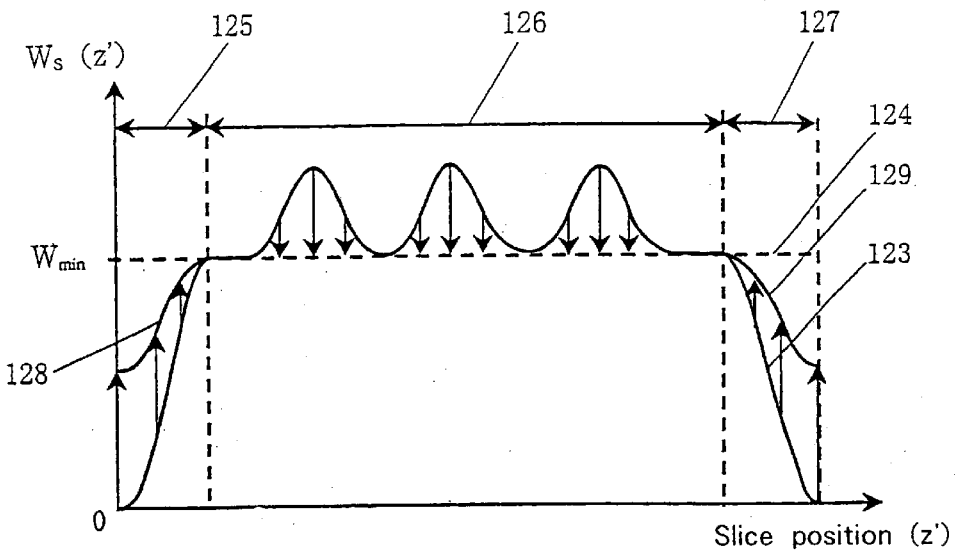
FIG. 9 shows another example of normalization process in the image processing of the present invention.

FIG. 9 shows a profile 123 of the sum W in case that the weighted addition is performed using the weight function 117' shown in FIG. 5 and a profile of the sum after normalization. As can be understood from the drawing, in the regions 125, 127 at the sides of the whole slab, the values of the profile 128, 129 of the sum W of the weight function decrease from $W_{min}$ 124 toward the sides. If the slice data whose sum $W(z')$ is not more than the constant S is normalized using the same N value used for the data whose $W(z')$ is more than the constant, noise part increases together with signal part and image becomes to include remarkably many noises. By performing normalization in a different manner for the data whose $S(z')$ is less than the constant S, images with few noise can be obtained.

Normalizing manner has been explained separately in case that the slab profile has a square or approximately square shape and in case that the profile declines toward the opposite sides. Which manner should be selected may be determined automatically by CPU 7 based on the C value (the equations (1)–(3)) or may be set previously for each apparatus.

CPU 7 reconstructs images using the thus normalized data (FIG. 2, step 208). The thus processed image data has no signal gap between slabs and is displayed as a blood image useful for diagnosis.

Although the overlapping degree of slabs is selected to be 50% in the aforementioned embodiment (FIG. 4), it is not limited to this and may be more or less than 50%. Practically, the overlapping degree of 60–75% is preferable. For example, when the overlapping degree is ⅔ (about 67%), data in the same position includes signals from three portions of, i.e., in-flow portion, intervening portion, and out-flow (outwash) portion and, therefore, blood imaging ability and uniformity of blood image can be improved. If the overlapping degree becomes larger, data to be added in the same position includes signals from various sites in one slab and the blood imaging ability and uniformity of blood image can be further improved to produce better images. However, larger the overlapping degree is, longer the measurement time is. Accordingly, the overlapping degree less than 75% is practical.

Although the present invention is applied to angiography in the aforementioned embodiment, the MRI apparatus and method of the present invention is not limited to this application and can be applied to any other imaging method employing the multi-slab imaging. In addition, the blood imaging sequence is not limited to that shown in the drawing and any known sequence can be employed.

Since the MRI apparatus of the present invention is provided with a function of weighted addition operation for overlapped data in a multi-slab measurement and a function of setting measurement parameters necessary for these processing, there can be obtained images having few boundary artifact, i.e., discontinuity of blood signals at the connecting part of slabs.

What is claimed is:

1. An MRI apparatus comprising means for selecting a plurality of slabs constituting a desired region of an object to be examined such that adjacent slabs partially overlap each other, means for performing three-dimensional data measurement of NMR signals successively for each slab, and means for producing composed three-dimensional images of the region of the object using the measurement data obtained from each slab;

wherein the means for producing three-dimensional images uses measured data of each overlapped slice position of both of the adjacent slabs for the overlapped portions of the adjacent slabs to obtain data for producing three-dimensional images.

2. The MRI apparatus of claim 1, wherein the overlapping degree of adjacent slabs is 50% or more.

3. The MRI apparatus of claim 2, wherein the overlapping degree of adjacent slabs is in the range of from 60% to 75%.

4. The MRI apparatus of claim 1, wherein the three-dimensional data measurement includes a blood flow measurement sequence according to the Time-of-flight method.

5. An MRI apparatus comprising means for selecting a plurality of slabs constituting a desired region of an object to be examined such that adjacent slabs partially overlap each other, means for performing three-dimensional data measurement of NMR signals successively for each slab, and means for producing composed three-dimensional images of the region of the object using the measurement data obtained from each slab;
wherein the means for producing three-dimensional images performs weighting of measured data of each slice position for each slab using a weight function and adding of the weighted data of all slabs taking account of slice positions of each slab, and produces composed three-dimensional images using the added data.

6. The MRI apparatus of claim 5, wherein the weight function used in the weighting process is a slab profile or an approximated curve thereof.

7. The MRI apparatus of claim 5, wherein the overlapping degree of adjacent slabs is 50% or more.

8. The MRI apparatus of claim 7, wherein the overlapping degree of adjacent slabs is in the range of from 60% to 75%.

9. The MRI apparatus of claim 5, wherein the means for producing composed three-dimensional images includes means for normalizing the added data obtained by adding data of all slabs such that value of the weight function has a constant value data in a predetermined region in the slab arranging direction.

10. The MRI apparatus of claim 9, wherein the means for normalizing normalizes such that value of the weight function falls within a value between the sum of the weight function and a constant value in a region where the sum of the weight function is lower than a predetermined value.

11. An MRI apparatus comprising a magnetic field generating means for generating a static magnetic field, RF magnetic field and gradient magnetic field in a space where an object to be examined is placed, detecting means for detecting nuclear magnetic resonance signals emitted from the object, signal processing means for processing the nuclear magnetic resonance signals and reconstructing images of a desired region of the object, display means for displaying the images, control means for controlling the magnetic field generating means, the detecting means and the signal processing means, and setting means for setting measurement conditions, and being equipped with multi-slab measurement sequence of repeatedly performing a three-dimensional measurement of slabs of the object while changing the position of a slab,
wherein the setting means comprises means for setting parameters for the multi-slab measurement, and
the signal processing means comprises means for performing weighted addition for data in a overlapped position of the slabs, and means for determining a weight function used for the weighted addition based on the parameters set by the setting means.

12. The MRI apparatus of claim 11, wherein the setting means comprises means for setting a number of slabs, a number of slices constituting one slab, and the overlap degree of the slab as the parameters.

13. An MRI apparatus comprising means for selecting a plurality of slabs of an object to be examined along the blood flow direction such that adjacent slabs partially overlap each other, means for performing three-dimensional data measurement of NMR signals successively for each slab, and means for producing three-dimensional blood flow images of the object using the measurement data obtained from each slab,
wherein the means for producing three-dimensional images uses data of flow-in side of one slab and data of flow-out side of another slab for the overlapped portions of the adjacent slabs to produce smoothened blood flow images.

14. An MRI method for reconstructing and displaying three-dimensional images of a desired region of an object to be examined by conducting a three-dimensional measurement of nuclear magnetic resonance signals successively for a plurality of slabs constituting the desired region of the object and image-processing of the measured data obtained from each slab, comprising the steps of:
selecting a plurality of slabs such that adjacent slabs partially overlap each other,
weighting and adding data of the same slice for the overlapped portion of slabs upon obtaining a composed measurement data of all slabs,
producing the three-dimensional image using the composed measurement data including the weight-added data,
producing three-dimensional images using the composed measurement data including the weight-added data, and
displaying the three-dimensional images in which boundary artifacts between adjacent slabs are suppressed.

15. An MRI method for reconstructing images of a desired region of an object to be examined by conducting a three-dimensional measurement of nuclear magnetic resonance signals successively for a plurality of slabs constituting the desired region of the object and image-processing of the measured data of each slab, comprising the steps of:
selecting the plurality of slabs so that adjacent slabs partially overlap each other,
weighting and adding data in the overlapped portion of the slabs for each slice position,
reconstructing images using the data, and
displaying the images in which boundary artifact between the adjacent slabs in the desired region is substantially eliminated.

16. An MRI method for reconstructing and displaying three-dimensional images of a desired region of an object to be examined by conducting a three-dimensional measurement of nuclear magnetic resonance signals successively for a plurality of slabs constituting the desired region of the object and image-processing of the measured data of each slab, comprising the steps of:
selecting a plurality of slabs such that adjacent slabs partially overlap each other,
weighting and adding data of the same slice for the overlapped portion of slabs to obtain a composed measurement data of all slabs,
producing the three-dimensional image using the composed measurement data containing the weight-added data, normalizing the composed measurement data containing the weight-added data such that value of the weight function has a constant value in a predetermined region in the slab arrangement direction,
producing three-dimensional images using the normalized data, and displaying the three-dimensional images in which boundary artifacts between adjacent slabs are suppressed.

17. An MRI method for reconstructing images of a desired region of an object to examined by conducting a three-dimensional measurement of nuclear magnetic resonance signals successively for a plurality of slabs constituting the desired region of the object and image-processing of the measured data of each slab, comprising the steps of:

selecting the plurality of slabs so that adjacent slabs partially overlap each other, weighting and adding data in the overlapped portion of the slabs for each slice position, normalizing the data corresponding to the slab profile, reconstructing images using the data, and displaying the images in which boundary artifact between the adjacent slabs in the desired region is substantially eliminated.

\* \* \* \* \*